(12) United States Patent
Suzuki et al.

(10) Patent No.: US 7,175,920 B2
(45) Date of Patent: *Feb. 13, 2007

(54) COPPER FOIL FOR HIGH-DENSITY ULTRA-FINE PRINTED WIRING BOARD

(75) Inventors: Akitoshi Suzuki, Imaichi (JP); Shin Fukuda, Imaichi (JP); Kazuhiro Hoshino, Imaichi (JP); Tadao Nakaoka, Imaichi (JP)

(73) Assignee: Circuit Foil Japan Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/180,181

(22) Filed: Jul. 13, 2005

(65) Prior Publication Data

US 2005/0249927 A1    Nov. 10, 2005

Related U.S. Application Data

(62) Division of application No. 10/380,900, filed as application No. PCT/JP01/08220 on Sep. 21, 2001, now Pat. No. 7,026,059.

(30) Foreign Application Priority Data

Sep. 22, 2000   (JP)   ............................. 2000-288087

(51) Int. Cl.
*B32B 15/00* (2006.01)
*C23C 28/00* (2006.01)

(52) U.S. Cl. .................. 428/615; 428/469; 428/472.1; 428/472.3; 428/606; 428/618; 428/632; 428/655; 428/668; 205/152; 205/183; 205/187; 205/205; 205/208

(58) Field of Classification Search ................ 428/626, 428/469, 472.1–472.3, 618, 621, 606, 615, 428/632, 655, 668; 205/152, 183, 187, 205, 205/208

See application file for complete search history.

(56) References Cited

U.S. PATENT DOCUMENTS

| 5,071,520 A | 12/1991 | Lin et al. |
| 5,114,543 A | 5/1992 | Kajiwara et al. |
| 5,366,814 A | 11/1994 | Yamanishi et al. |
| 6,346,335 B1 | 2/2002 | Chen et al. |
| 6,447,929 B1 | 9/2002 | Wang et al. |

FOREIGN PATENT DOCUMENTS

| EP | 0 398 721 A | 11/1990 |
| EP | 0 960 725 A | 12/1999 |
| JP | 57-20347 A | 2/1982 |
| JP | 8-181432 A | 7/1996 |
| JP | 2000-331537 A | 11/2000 |

*Primary Examiner*—Cathy F. Lam
(74) *Attorney, Agent, or Firm*—Frishauf, Holtz, Goodman & Chick, P.C.

(57) ABSTRACT

The present invention is to provide an ultra-thin copper foil with a carrier which comprises a release layer, a diffusion preventive layer and a copper electroplating layer laminated in this order, or a diffusion preventive layer, a release layer and a copper electroplating layer laminated in this order on the surface of a carrier foil, wherein a surface of the copper electroplating layer is roughened; a copper-clad laminated board comprising the ultra-thin copper foil with a carrier being laminated on a resin substrate; a printed wiring board comprising the copper-clad laminated board on the ultra-thin copper foil of which is formed a wiring pattern; and a multi-layered printed wiring board which comprising a plural number of the above printed wiring board being laminated.

17 Claims, 2 Drawing Sheets

COPPER FOIL FOR HIGH-DENSITY ULTRA-FINE PRINTED WIRING BOARD

This application is a divisional application of application Ser. No. 10/380,900, filed Mar. 20, 2003 now U.S. Pat. No. 7,026,059, which is the United States national phase application of International Application PCT/JP01/08220, filed Sept. 21, 2001, which is hereby incorporated in its entirety herein by this reference.

TECHNICAL FIELD

The present invention relates to an ultra-thin copper foil with a carrier which is used in producing a printed wiring board to be used for fine pattern, especially to an ultra-thin copper foil with a carrier that enables a production of a copper clad laminated board from a resin substrate which requires casting or pressing at a high temperature, and enables a process of drilling holes by $CO_2$ laser directly through the copper foil.

BACKGROUND ART

A printed wiring board has been produced as following.

First, a thin copper foil for surface circuit formation is placed on a surface of an electric insulating substrate comprising a glass-epoxy resin or a glass-polyimide resin, etc., and then, it is heated under pressure to prepare a copper clad laminated board.

Subsequently, on this copper clad laminated board, through-holes are provided and plated in order, and by carrying out an etching treatment on a copper foil located on a surface of the copper clad laminated board, a wiring pattern is formed equipped with a desired line width and a desired line pitch. Finally, formation of solder resist or other finishing treatment is carried out.

To a copper foil to be used in this stage, a surface side which is to be attached to a substrate by heating under pressure is subjected to a surface-roughening treatment, so that it can exhibit an anchoring effect against the substrate with this rough surface, thereby enhancing a bond strength between the substrate and the copper foil to ensure reliability as a printed wiring board.

More recently, there has been used a copper foil with a resin in which a matte side of a copper foil has been coated in advance with an adhesive resin such as an epoxy resin and then, the adhesive resin is made an insulating resin layer in a semi-cured state (B stage). And a printed wiring board, especially a build-up wiring board has been prepared by attaching a side of the insulating layer onto a substrate by laminating press under heating.

Further, in accordance with a higher integration of the electronic parts of various kinds, a wiring pattern is also required to be of high density in those build-up wiring board, and there arise a need for printed wiring board with a wiring pattern comprising wirings of fine line width and line pitch, so called a fine pattern. For example, in case of a printed wiring board to be used for a semiconductor packaging, there has been desired a printed wiring board having a high density extra-fine wiring with a line width and line pitch of around 30 μm, respectively.

If a thick copper foil is used as a copper foil for forming a printed wiring, a time required for etching through the copper foil to the surface of the substrate is prolonged. As a result, the formed wiring pattern tends to loose a verticality at the sidewall of the wiring, decreasing an etching factor (Ef) represented by the following formula:

$$Ef=2H/(B-T)$$

wherein H represents a thickness of a copper foil, B represents a bottom width of a formed wiring pattern and T represents a top width of the formed wiring pattern.

Such a problem is not so serious when a line width of a wiring in a formed wiring pattern is wide. However, when a wiring pattern has a narrow line width, it can be resulted in open circuit.

On the other hand, in case of thinning a relatively thin copper foil such as a usual copper foil having 9 μm thickness or 12 μm thickness to a copper foil with a thickness of 3 to 5 μm by half etching, it is possible, in fact, to make the Ef value large. However, to ensure contact strength with the substrate, a surface of the copper foil contacting with the substrate is a roughened surface usually having a roughness Rz of 5 to 6 μm or so. Copper nodules of this roughened surface are pushed into the substrate, and therefore, longer time is required for etching treatment to remove those copper nodules by etching. Here, the surface roughness Rz means Rz regulated by the definition of "5.1 Ten-points average roughness" of "Definition and indication of surface roughness" mentioned in JIS-B-0601 (1994).

If the copper nodules which have been pushed into the substrate were not removed completely, they become residual copper, causing an insulating malfunction when line pitches in a wiring pattern are narrow.

Therefore, in a process of removing by etching the copper nodules which have been pushed into the substrate, etching of sidewalls of the already formed wiring pattern are progressed at the same time, resulting a lower Ef value.

In addition, a relatively thin copper foil having a thickness of 9 μm or 12 μm has a low mechanical strength, thereby easily causing a wrinkle or fold in a production process of a printed wiring board, and sometimes resulting in a breakage of the copper foil. Therefore, a problem arises such that the most careful attention must be paid in handling thereof.

As is described above, it is practically very difficult to produce a printed wiring board on which a fine wiring pattern is formed, whose Ef value is large, and at the same time, whose contact strength with a substrate is also high. Particularly, it is virtually impossible to form a wiring pattern of high density and extra-fine wiring with a line pitch and line width of around 30 μm, using a commercially available copper foil. And it is a fact that development of such a copper foil to enable production of a printed board with a high density extra-fine wiring pattern is earnestly desired.

A copper foil to be used in such a fine pattern preferably has a thickness of 9 μm or less, particularly suitably of 5 μm or less.

As an ultra-thin copper foil to be used for such a fine pattern, there has been proposed a complex foil in which an ultra-thin copper foil is directly electrodeposited on one surface of a carrier foil, interposed by a release layer (Japanese Patent Publication No. 16329/1978), and also a composite foil in which a chromate coating layer, a copper-nickel alloy layer and an ultra-thin copper foil layer are provided on a matte side of a carrier copper foil having a rough surface (Japanese Patent Publication No. 18401/1996).

Also, the present applicant has previously filed an application directed to a copper foil which is an ultra-thin copper foil with a carrier, comprising a copper foil with a surface roughness (Rz) of 1.5 µm or less as a carrier, and on the surface thereof, comprising a release layer and a copper electroplating layer, laminated in this order, and characterized in that the outermost surface of the copper electroplating layer is subjected to roughening (Japanese Provisional Patent Publication No. 269637/2000), and an ultra-thin copper foil with a carrier comprising a copper foil as a carrier, and on the surface thereof, comprising a release layer and a copper electroplating layer laminated in this order, and characterized in that the carrier foil and the copper electroplating layer are adhered more strongly in a proximate parts of the right and left edge than in a center part, and that the outer-most surface of the copper electroplating layer is subjected to roughening (Japanese Provisional Patent Publication No. 331537/2000).

Applied Example of these ultra-thin copper foils with a carrier is shown in FIG. 1. The ultra-thin copper foil with a carrier, in which a release layer 2 and a copper electroplating layer 4 are formed in this order on one surface of a foil 1 as an carrier (hereinafter referred to as "a carrier foil"), has the outermost surface 4a of the copper electroplating layer surface-roughened. This roughened surface 4a is placed on a glass epoxy substrate (not shown in the figure), the whole material is pressed under heat for bonding, and then, the carrier foil 1 is peeled off and removed to expose a contacting surface of the copper electroplating layer with the carrier foil, on which a predetermined wiring pattern is formed.

The carrier foil 1 functions as a reinforcing material (carrier) for back-up until the above-mentioned thin copper electroplating layer 4 and the substrate are adhered. Moreover, the release layer 2 is a layer provided for promoting a peeling in separating the above-mentioned copper electroplating layer 4 and the carrier foil. It can be removed together with the carrier foil when the carrier foil is removed by peeling, and therefore, the carrier foil can be removed completely and easily.

On the other hand, to the copper electroplating layer 4 adhered to the glass epoxy substrate, through-holes are provided and plated in this order. And then, the copper foil located on the surface of the copper clad laminated board is subjected to an etching treatment to form a wiring pattern equipped with a desired line width and a desired line pitch. Finally, formation of a solder resist and other finishing treatment are carried out.

The ultra-thin copper foil with a carrier of this type enables formation of a fine pattern. In addition, it has a reputation that it is especially suitable for production of a wiring board of build-up type, due to its excellent handling property upon operation. However, on the other hand, there has been actualized problems as below.

(1) In case of using a heat resistant glass epoxy resin laminated board such as FR-4 grade, temperature at heat pressure is around 170° C., therefore, it is unlikely that the carrier foil cannot be peeled off after a copper foil with a carrier is laminated on the resin substrate. However, in case of using a higher heat resistant resin, especially using a polyimide resin for a substrate, temperature employed for a process exceeds 300° C. in either case of a casting method and a laminating press method. Therefore, when a chromium plating layer is used as a release layer as shown in Japanese Patent Publication No. 16329/1978, chromium is dispersed in a copper layer as a carrier causing adhesion of the carrier foil and the ultra-thin copper foil, making release infeasible.

A mechanism of this phenomenon that release becomes impossible can be considered as follows.

Diffusion of chromium to the ultra-thin copper side occurs by heating to high temperature, but is rather small as compared to diffusion of the same to the carrier foil. This is considered that the surface of the chromium layer is covered by a thin chromium hydrated oxide layer. To the contrary, diffusion of chromium occurs to the carrier foil side so that the surface portion of the carrier foil becomes a copper content-enriched copper-chromium alloy surface. The copper of the copper-chromium alloy binds to the copper of the ultra-thin copper foil by a metal bond whereby the carrier foil and the ultra-thin copper foil are considered to be adhered.

Also, the same is expected in case of using a chromate coating layer and a copper-nickel alloy layer as a release layer as shown in Japanese Patent Publication No. 18401/1996. In this case, too, especially copper in the copper-nickel alloy layer binds to the copper of the ultra-thin copper foil by a metal bond whereby the carrier foil and the ultra-thin copper foil are considered to be adhered.

(2) In formation of a via (via hole) of a build-up wiring board, a laser via method is mainly used due to its high performance, etc. Kinds of the preferable laser may include $CO_2$ gas laser, Xe laser, excimer laser, YAG laser, Ar laser, etc.

Currently, it is $CO_2$ gas laser that is mainly used. However, a wavelength of light that $CO_2$ gas laser oscillates is in a region of infrared rays with a wavelength around 10,600 nm, and most of light and electromagnetic wave of this region is reflected at the surface of the copper foil. Accordingly, it is impossible to carry out laser drill directly from the surface of the copper foil. Therefore, a conformal mask method is employed in which part of the copper foil subjected to drilling process is removed by etching in advance followed by carrying out drilling process.

The conformal mask method requires a troublesome process in which an etching resist is coated on a copper electroplating layer 4 in FIG. 1, except for a part on which via holes are aimed to be provided, and after the copper foil is once removed by etching, the resin part is penetrated by combustion with $CO_2$ gas laser. Accordingly, if it becomes possible to carry out drilling process directly through the copper foil by $CO_2$ gas laser, the drilling process can be simplified.

An object of the present invention is to provide an ultra-thin copper foil with a carrier to be used in a production of a printed wiring board for a fine pattern, that resolves the above-mentioned two problems. That is, the present invention provides an ultra-thin copper foil with a carrier, which facilitates peeling of the carrier foil from a copper clad laminated board prepared by casting or hot-pressing at a high temperature and which enables direct drill by $CO_2$ gas laser from the surface of the ultra-thin copper foil.

SUMMARY OF THE INVENTION

The present invention relates to an ultra-thin copper foil with a carrier comprising a release layer, a diffusion preventive layer and a copper electroplating layer laminated in this order on the surface of a carrier foil, wherein an outermost surface of the copper electroplating layer is roughened.

In another embodiment of the present invention, it is an ultra-thin copper foil with a carrier comprising a diffusion preventive layer, a release layer and a copper electroplating layer laminated in this order on the surface of the carrier foil, wherein an outermost layer of the copper electroplating layer is roughened.

BEST MODE FOR CARRYING OUT THE INVENTION

For the carrier foil to be used in the present invention, an aluminum foil, a stainless steel foil, a titanium foil, a copper foil, a copper alloy foil, etc., may be used, and in the point of a cost, an electrodeposited copper foil, an electrodeposited copper alloy foil, a rolled copper foil or a rolled copper alloy foil, etc. is preferred.

The release layer is preferably a chromium layer or a chromium hydrated oxide layer. Also, the diffusion preventive layer is preferably a layer to which a wavelength of light oscillated by $CO_2$ gas laser can be easily absorbed. This layer to which a wavelength of light oscillated by $CO_2$ gas laser can be easily absorbed may comprise at least one element selected from the group consisting of nickel, cobalt, iron, chromium, molybdenum, tungsten, copper, aluminum and phosphorus, and may be a single layer comprising a metal, or an alloy layer comprising two or more metals or a metal oxide layer of one or more kinds of an oxide the above-mentioned metals.

Figure 1:
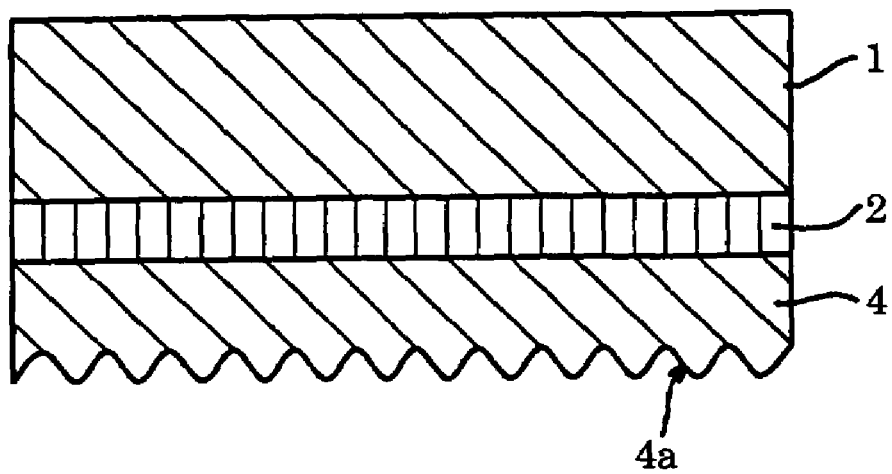
FIG. 1 is a sectional view showing a sectional structure of a conventional ultra-thin copper foil with carrier without containing a diffusion preventive layer.
Figure 2:
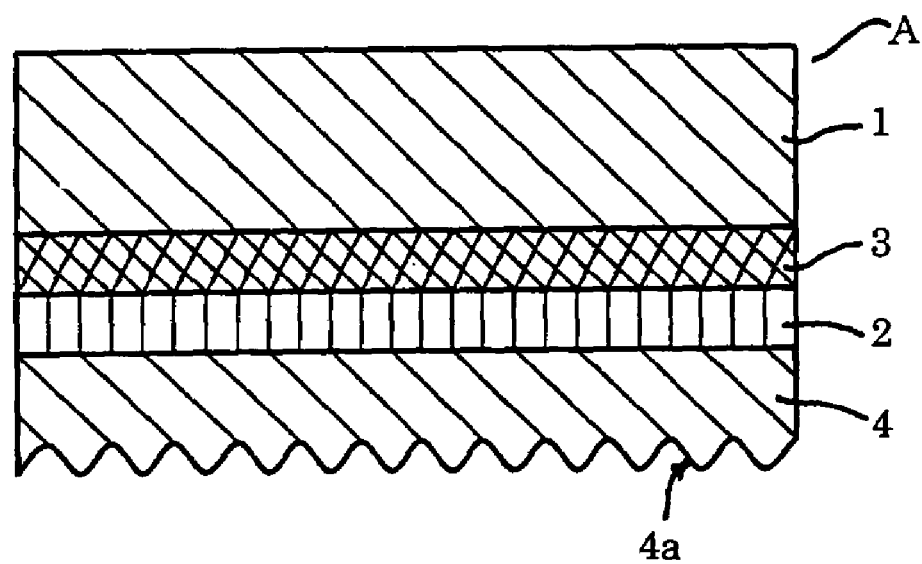
FIG. 2 is a sectional view showing a sectional structure of an ultra-thin copper foil A with carrier of the present invention.

An example of the ultra-thin copper foil with a carrier of the present invention is shown in FIG. 2. This ultra-thin copper foil A with a carrier is formed by laminating a diffusion preventive layer 3, a release layer 2 and a copper electroplating layer 4 on one surface of a carrier foil 1 in this order, and a surface 4a of the outermost layer which is the copper electroplating layer 4 is a roughened surface. The roughened surface of the ultra-thin copper foil A with a carrier is used in an embodiment in which it is laminated to a substrate (not shown in the figure), the whole material is thermally pressed and the carrier foil 1 is peeled off and removed to expose the adhered surface to the carrier side of the copper electroplating layer, and a predetermined wiring pattern is formed at the exposed surface.

The carrier foil 1 acts as a reinforcing material (a carrier) to backup the above-mentioned thin copper electroplating layer 4 until it is joined to a substrate. The carrier foil itself preferably has a thickness of 1 mm or less, more preferably about 7 μm to about 70 μm. If it is less than the above range, it cannot act as a carrier. On the other hand, if it is thicker than the above range, it has no problem as a carrier but when plating is carried out continuously for the formations of the release layer and the copper electroplating layer, it is necessary to make a tension of the foil in a continuous plating line large so that a large instrument is required whereby it is not preferred.

The release layer 2 in the present invention is a layer for making peeling property of the copper electroplating layer 4 and the carrier foil good when they are peeled off, and it can peel off the carrier foil cleanly and easily. This release layer is integrally removed with the carrier foil. The release layer 2 is preferably a chromium layer or a chromium hydrated oxide layer.

When it is a chromium layer, it is preferably prepared by a conventionally known chromium plating bath, e.g., a plating bath so-called Surgent bath, and by an electroplating.

A peeling strength at the time of peeling the carrier foil varies depending on an attached amount of the chromium layer. If an attached amount of the chromium plating is large, chromium plating completely covers the whole surface of the carrier foil so that the peeling strength is considered to be a force to peel off the binding between the chromium plating surface and a metal plating, an alloy plating or an oxide attached thereafter.

To the contrary, when an attached amount of the chromium plating is not large, the surface of the carrier foil 1 is not completely covered by chromium plating. Thus, a peeling strength is considered to be a force to peel off a binding force between the exposed ground metal and the chromium plating, and a metal plating, an alloy plating or an oxide adhered thereon.

Accordingly, the peeling strength of the carrier may vary depending on the attached amount of the chromium plating, but a certain amount or more of the chromium plating is attached, the peeling strength is unchanged any more. An attached amount of the chromium plating is preferably 50 $mg/dm^2$ or less. This is because the peeling strength of the carrier is not changed even when the attached amount of the plating is increased.

In the case of the chromium hydrated oxide layer, it is necessary to form the layer by dipping a material in an alkali treating solution having a pH of more than 7, or by electrolysis. This is because if plating is carried out on a material formed by immersing the material in a treating solution at an acidic region of a pH of less than 7 or by electrolysis, a number of pinholes generated at the diffusion preventive layer and the copper electroplating layer formed thereafter becomes large.

If a number of pinholes generated at the copper electroplating layer becomes large, failure occurs in many cases when a printed wiring board is produced by laminating it to a resin substrate and peeling the carrier off.

The failure is that when a pinhole(s) exist(s) at the ultra-thin copper foil when a wiring is formed by etching, if the pinhole is large, the wiring at the portion is broken.

When plating is carried out on the release layer formed by dipping a material in an alkali treating solution having a pH of more than 7, or by electrolysis using the same, a number of pinholes at the diffusion preventive layer and at the copper electroplating layer markedly reduces. This can be estimated that if an alkali treating solution is used, a thickness of the chromium hydrated oxide layer becomes thin and uniform as compared with the case where an acidic treating solution is used, and a bonding ratio of the chromium oxide and water molecule is different so that a conductivity is improved.

When a chromium plating layer is used as a release layer, a number of pinholes at the diffusion preventive layer and the copper electroplating layer becomes extremely little. This can be considered that the chromium plating layer has conductivity so that a plating current uniformly flows through the chromium plating layer at the time of effecting plating thereon, and, precipitation occurs uniformly at the plating layer formed thereon so that pinholes are considered to be difficultly formed.

To the contrary, when plating is carried out on a release layer formed by dipping a material in an alkali treating solution having a pH of less than 7 using the same, or by electrolysis, as compared with the case where the chromium hydrated oxide layer is treated by an alkali treating solution having a pH of more than 7, a diffusion preventive layer and a copper electroplating layer are formed thereon, a plating current does not flow uniformly which might be caused by high insulating property of the film itself, so that a number of pinholes generated becomes large.

Also, the number of the pinholes is affected by an attached amount even when plating is carried out by dipping a material in an alkali treating solution having a pH of more than 7, or by electrolysis using the same. An attached amount of the chromium hydrated oxide which difficultly causes pinholes is preferably 0.1 mg/dm$^2$ or less in terms of Cr. This is because if the attached amount is larger than the above, a number of pinholes generated becomes large.

The diffusion preventive layer 3 to be formed on the release layer 2 is a layer to prevent diffusion of the release layer 2 when the ultra-thin copper foil with a carrier is mounted on a resin substrate and subjected to press lamination. When a copper electroplating layer 4 is electroplated on a chromium layer or a chromium hydrated oxide layer 2 without forming the diffusion preventive layer 3, metal bonding occurs between a carrier foil and the copper electroplating layer when the material is heated at a high temperature to cause an extremely firm bonding force whereby it is difficult to peel off the carrier foil through the release layer. On the other hand, when a layer 3 which prevents diffusion and easily absorbs light at wavelengths oscillated by $CO_2$ gas laser is plated on a chromium layer or a chromium hydrated oxide layer 2 deposited, and copper is further plated thereon, the resulting material finely peels off from an interfacial portion between the chromium layer or the chromium hydrated oxide layer 2 and the diffusion preventive layer 3, and absolutely neither chromium nor chromium hydrated oxide remains at the side of the layer 3.

The layer 3 of the present invention which prevents diffusion at the time of heating and easily absorbs light at wavelengths oscillated by $CO_2$ gas laser comprises at least one element selected from the group consisting of nickel, cobalt, iron, chromium, molybdenum, tungsten, copper, aluminum and phosphorus, and may be a single metal layer, an alloy layer of two or more metals, or a layer of at least one metal oxide.

As a plating by single metal, there may be mentioned nickel plating, cobalt plating, iron plating, aluminum plating, etc.

As a binary alloy plating, there may be mentioned nickel-cobalt plating, nickel-iron plating, nickel-chromium plating, nickel-molybdenum plating, nickel-tungsten plating, nickel-copper plating, nickel-phosphorus plating, cobalt-iron plating, cobalt-chromium plating, cobalt-molybdenum plating, cobalt-tungsten plating, cobalt-copper plating, cobalt-phosphorus plating, etc.

As a ternary alloy plating, there may be mentioned nickel-cobalt-iron plating, nickel-cobalt-chromium plating, nickel-cobalt-molybdenum plating, nickel-cobalt-tungsten plating, nickel-cobalt-copper plating, nickel-cobalt-phosphorus plating, nickel-iron-chromium plating, nickel-iron-molybdenum plating, nickel-iron-tungsten plating, nickel-iron-copper plating, nickel-iron-phosphorus plating, nickel-chromium-molybdenum plating, nickel-chromium-tungsten plating, nickel-chromium-copper plating, nickel-chromium-phosphorus plating, nickel-molybdenum-tungsten plating, nickel-molybdenum-copper plating, nickel-molybdenum-phosphorus plating, nickel-tungsten-copper plating, nickel-tungsten-phosphorus plating, nickel-copper-phosphorus plating, cobalt-iron-chromium plating, cobalt-iron-molybdenum plating, cobalt-iron-copper plating, cobalt-iron-phosphorus plating, cobalt-chromium-molybdenum plating, cobalt-chromium-tungsten plating, cobalt-chromium-copper plating, cobalt-chromium-phosphorus plating, cobalt-molybdenum-tungsten plating, cobalt-molybdenum-copper plating, cobalt-molybdenum-phosphorus plating, cobalt-copper-phosphorus plating, and the like.

Also, as an oxide, there may be mentioned nickel oxide, cobalt oxide, iron oxide, chromium oxide, molybdenum oxide, tungsten oxide, copper oxide, aluminum oxide, phosphorus oxide, and the like. Moreover, there may be mentioned a mixture of the above-mentioned two or more kinds of oxides.

Moreover, two or more kinds of layers selected from the single metal plating layer, the alloy plating layer and an oxide layer may be provided.

In these plating layers or the oxide layers, even when a temperature of 300° C. or higher which is a processing condition in the case of a polyimide resin substrate is applied to, these layers prevent from diffusion so that it is possible to easily peel off the carrier foil and the ultra-thin copper foil after the processing.

Also, when a treatment of the single metal plating layer, the alloy plating layer or the oxide layer is to be carried out, it is important to adjust a pH of a treating solution. In the present invention, the treatment is preferably carried out with a treating solution maintaining the pH to 2 or higher.

When the metallic chromium layer is used as the release layer, the above-mentioned treatment is not required, but when the chromium hydrated oxide layer is used, if the treatment is not carried out with a treating solution having a pH within the above-mentioned range, peeling off of the carrier foil becomes difficult after laminating the ultra-thin copper foil with a carrier to the resin substrate.

If the treatment is carried out with a treating solution having a pH out of the above-mentioned range, it can be expected that chromium hydrated oxide is dissolved in the treating solution so that peeling off of the carrier foil becomes difficult.

In the case of the ultra-thin copper foil with a carrier defined in claim 1, which comprises a release layer 2, a diffusion preventive layer 3 and a copper electroplating layer 4 laminated in this order on the surface of a carrier foil 1, wherein an outermost surface of the copper electroplating layer 4 is roughened, when the carrier foil 1 is peeled off and removed, the release layer 2 is integrally removed with the carrier foil 1, so that a diffusion-preventive layer 3 covers an outer surface of the ultra-thin copper foil. This diffusion preventive layer 3 has a good absorption ratio of laser light so that when $CO_2$ gas laser is directly irradiated to the surface thereof, it is possible to make a hole of the substrate on the diffusion preventive layer 3 through the ultra-thin copper foil.

When the release layer 2 is a chromium plating layer, diffusion of chromium to the copper electroplating layer 4 side by heating at high temperature can be prevented by the diffusion preventive layer 3. To the contrary, diffusion of chromium occurs to the carrier foil 1 side, and the surface of the carrier foil 1 becomes a copper-chromium alloy surface enriched in a copper content. However, the copper in the copper-chromium alloy does not bind to the copper of the copper electroplating layer 4 by metal bond due to the presence of the diffusion preventive layer 3 covering the surface of the copper electroplating layer 4 as a barrier. As a result, it can be considered that the carrier foil 1 and the copper electroplating layer 4 never adhere.

Also, the same is expected in case of a chromate hydrated oxide layer used as a release layer 2, and the copper of the carrier foil 1 does not bind to the copper of the copper electroplating layer 4 by metal bond due to the presence of the diffusion preventive layer 3 as a barrier. As a result, it can be considered that the carrier foil 1 and the copper electroplating layer 4 never adhere.

Also, in the case of the ultra-thin copper foil with a carrier defined in claim 2, which comprises a diffusion preventive layer 3, a release layer 2 and a copper electroplating layer 4 laminated in this order on the surface of a carrier foil 1, wherein an outermost surface of the copper electroplating layer 4 is roughened, when the carrier foil 1 is peeled off and removed, the diffusion preventive layer 3 is integrally removed with the release layer 2 and the carrier foil 1, so that the diffusion preventive layer 3 does not cover the ultra-thin copper foil and the ultra-thin copper foil remains as such.

When the release layer 2 is a chromium plating layer, diffusion of chromium to the carrier foil 1 side by heating at high temperature can be prevented by the diffusion preventive layer 3. Diffusion of chromium does not so proceed to the copper electroplating layer 4 side since the chromium layer surface is covered by a thin chromium hydrated oxide layer. As a result, it can be considered that the carrier foil 1 and the copper electroplating layer 4 are not adhered due to the presence of the diffusion preventive layer 3 as a barrier.

Also, when a release layer 2 is a chromate hydrated oxide layer, the copper of the carrier foil 1 does not bind to the copper of the copper electroplating layer 4 by metal bond due to the presence of the diffusion preventive layer 3 as a barrier. As a result, it can be considered that the carrier foil 1 and the copper electroplating layer 4 never adhere.

In this case, before making a hole with $CO_2$ gas laser, it is preferred to coat a substance absorbing light of the $CO_2$ gas laser well or roughen the surface to improve absorption of light from the $CO_2$ gas laser.

As the carrier foil 1, a foil of copper or copper alloy, particularly an electrodeposited copper foil, an electrodeposited copper alloy foil, a rolled copper foil or a rolled copper alloy foil is preferably used.

Also, the surface of the above-mentioned carrier foil 1 is preferably a matte side or a shiny side of an untreated electrodeposited copper foil or an untreated electrolytic copper alloy foil, or a roil-finished surface of a rolled copper foil or a rolled copper alloy foil, and more preferably a foil in which the matte side or the shiny side of the untreated electrodeposited copper foil or the untreated electrodeposited copper alloy foil is subjected to roughening treatment, or a rolled foil in which at least one surface thereof is subjected to roughening treatment.

The roughening treatment is preferably carried out by employing either of the system in which the surface is chemically or electrochemically roughened or the system in which roughening particles are attached to the surface of a material by electroplating. Particularly when roughening particles are attached by electroplating, a particle size of the roughening treatment is suitably within the range of 0.01 μm to 5.0 μm. The copper foil of the present invention has a good absorption ratio of laser light by the presence of the diffusion preventive layer 3 which likely absorbs light at wavelengths oscillated by the $CO_2$ gas laser. When a carrier foil having an uneven surface is used, the absorption ratio of the $CO_2$ gas laser light is heightened since a shaping effect is added.

However, the particle size is smaller than 0.01 μm, an effect of subjecting to roughening treatment is little while if it exceeds 5.0 μm, unevenness of the copper electroplating layer effecting thereafter becomes remarkable and the resulting ultra-thin copper foil becomes a foil having a large surface roughness even when the copper foil itself is ultra-thin so that it is not suitable for a copper foil for fine pattern.

After drilling a hole by laser, the diffusion preventive layer 3 which likely absorbs light at wavelengths oscillated by the $CO_2$ gas laser is dissolved in a soft etching step in the preparation steps of a multi-layer printed wiring board and removed. As a soft etching solution, an etching solution such as sulfuric acid-hydrogen peroxide, persulfate, etc., is generally used.

Then, the copper electroplating layer 4 is formed and the surface 4a of which is then roughened. More specifically, at the final stage of forming the copper electroplating layer 4, copper particles having 0.2 to 2.0 μm or so are deposited as nodules on the surface of the copper plating layer already formed (this treatment is usually called to as "a roughening treatment"). The reason why the surface of the copper electroplating layer is made a roughened surface by such a treatment is to heighten an adhesion strength between the ultra-thin copper foil A with a carrier and a substrate when they are adhered by pressing under heat (laminating press bonding).

In the ultra-thin copper foil A with a carrier, it is preferred to further form a nickel layer and a zinc layer on the roughened surface 4a in this order.

This zinc layer acts to heighten adhesion strength with the substrate by preventing deterioration of the substrate resin due to the reaction of the copper electroplating layer 4 and the substrate resin or preventing surface oxidation of the copper electroplating layer 4 when the ultra-thin copper foil A with a carrier and the substrate are adhered by pressing under heat. Also, the nickel layer acts to prevent from thermal diffusion of zinc in the zinc layer to the copper electroplating layer side at the time of laminating press bonding of the ultra-thin copper foil A with a carrier to the substrate whereby it acts to effectively develop the function of the zinc layer.

Incidentally, these nickel layer and zinc layer can be formed by applying the conventionally known electroplating method or electroless plating method. Also, the nickel layer may be formed by pure nickel or by a phosphorus-containing nickel alloy containing 6% by weight or less of phosphorus.

Also, when a chromate treatment is further carried out on the surface of the zinc layer, an anti-oxidation layer is formed on the surface thereof so that it is further preferred. As the chromate treatment to be applied, the conventionally known method can be used, and there may be mentioned, for example, a method disclosed in Japanese Provisional Patent Publication No. 86894/1985. By adhering chromium oxide or a hydrate thereof, etc. thereon in terms of a chromium amount of 0.01 to 0.2 mg/dm$^2$ or so, an excellent corrosion-preventive effect can be applied to the copper foil.

Also, to the surface of which the above-mentioned chromate treatment has carried out, when a surface treatment is further carried out by using a silane coupling agent, a functional group having a strong affinity to an adhesive is imparted to the surface of the copper foil which is the surface at an adhering side to the substrate. By doing so, an adhesive strength between the copper foil and the substrate is more improved, and corrosion-preventive effect and heat resistance of the copper foil are further improved whereby the treatment is preferably carried out.

As the silane coupling agent to be used, there may be mentioned, for example, vinyltris(2-methoxyethoxy)-silane, 3-glycidoxypropyltrimethoxysilane, N-(2-amino-ethyl)-3-aminopropyltrimethoxysilane, 3-aminopropyltriethoxysilane, and the like. These silane coupling agents are each generally used by dissolving in water with a concentration of 0.001 to 5% by weight, coating the aqueous solution onto the surface of the copper foil and dried under heating as such. Incidentally, in place of the silane coupling agent, a titanate type or zirconate type coupling agent may be used to give the similar effects to those of the silane coupling agent.

The ultra-thin copper foil A with a carrier has a constitution as mentioned above so that it has a large adhesion strength with the substrate and it is possible to form a fine wiring pattern. Also, even when an ultra-thin copper foil with a thickness of 9 µm or less is used as a copper foil for forming a circuit, it is reinforced by a carrier foil enriched in stiffness so that neither wrinkle nor fold occurs at the time of handling.

Figure 3:
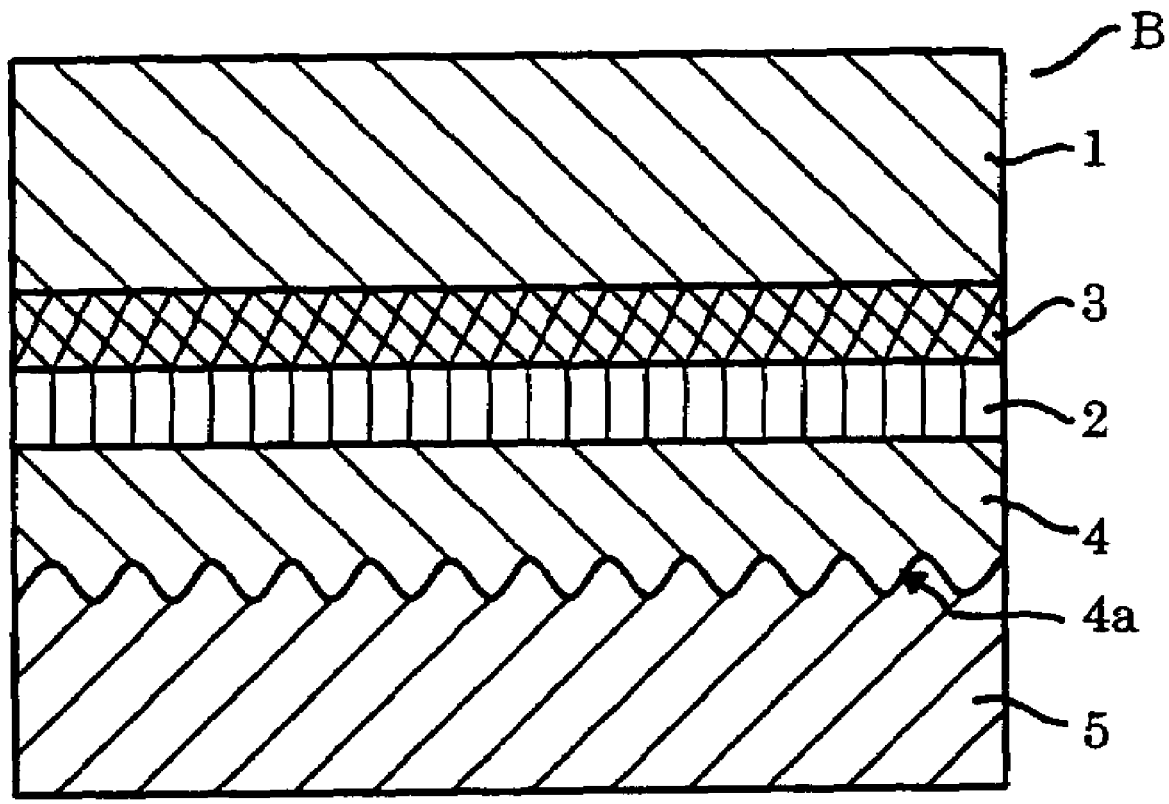
FIG. 3 is a sectional view showing a sectional structure of a copper foil B with resin of the present invention.

Next, as a second example of the ultra-thin copper foil with a carrier, a copper foil B with a resin in which a roughened surface of the ultra-thin copper foil with a carrier is further coated by a resin for adhesion is shown in FIG. 3. This copper foil B with a resin takes a constitution in which the roughened surface 4a of the ultra-thin copper foil A with a carrier shown in FIG. 2 is further coated by a resin for adhesion, and an insulating resin layer 5 comprising the resin for adhesion in a semi-cured state is adhered and joined to the copper foil. The term "semi-cured" herein mentioned means a state of the so-called B-stage resin, and a state in which there is no sticky feeling even when a person touched the surface with fingers, the material can be stored by laminating the insulating resin layers, and a curing reaction occurs when it is further subjected to heat treatment.

For formation of the insulating resin layer 5, a thermosetting resin is used. The kind of the resin is not particularly limited, and there may be preferably mentioned, for example, an epoxy resin, a polyimide resin, a poly-functional cyanic acid ester compound and the like.

These resins may be each dissolved in a solvent such as methyl ethyl ketone (MEK), toluene, etc., to prepare a resin solution. Then, the resin solution is applied onto the roughened surface 4a of the copper electroplating layer 4 by, for example, a roll coater method, and then, the solvent is removed by drying under heating, if necessary, to make a state of a B-stage resin. For drying, for example, a hot-air drying oven may be used and drying is carried out at a drying temperature of 100 to 250° C., preferably 130 to 200° C.

The copper foil B with a resin is used with an embodiment that, after laminating the insulating resin layer 5 to the substrate (not shown in the figure), the whole material is subjected to laminating press bonding to thermally cure the insulating resin layer, and then, the carrier foil 1 is peeled off to expose the copper electroplating layer 4 which is a surface of the diffusion preventive layer 3 side at the outside of the copper electroplating layer, and a predetermined wiring pattern is formed on the layer.

A thickness of the insulating resin layer 5 is preferably 20 to 80 µm. If the thickness of the insulating resin layer 5 is made thinner than 20 µm, an adhesive force is lowered. Thus, when the copper foil with a resin is laminated to a substrate having an inner layer material without interposing a prepreg material, it is difficult to ensure interlayer insulation between a circuit at the inner layer material and the copper foil. On the other hand, if the thickness of the insulating resin layer 5 is made thicker than 80 µm, it is difficult to form an insulating resin layer with a desired thickness by single coating step, and extra fee for materials and step numbers are required so that it is economically disadvantageous. Moreover, a flexibility of the formed insulating resin layer is low so that cracks, etc., are likely caused at the time of handling, and smooth lamination becomes difficult since excessive resin flow occurs at the time of laminating press under heating with the inner layer material.

Moreover, as the other product form of the copper foil with a resin, it is possible to form a copper foil with a resin in the form of a copper foil by coating the roughened surface 4a with an insulating resin to make a semi-cured state, and then, peeling the carrier foil 1 to form a copper foil with a resin having no carrier foil 1. In this case, the diffusion preventive layer 3 which easily absorbs light at wavelengths oscillated by $CO_2$ gas laser acts as corrosion resistant treatment.

EXAMPLES

In the following, the present invention is explained in more detail by referring to Examples.

Example 1

On a shiny side (shiny side roughness Rz=1.4 µm) of an untreated electrodeposited copper foil with a thickness of 35 µm (a carrier foil 1), an electroplating of chromium was carried out continuously to form a chromium-plating layer (a release layer 2) with an attached amount of 0.50 mg/dm$^2$. Successively, on this chromium-plating layer, Ni—P electroplating was carried out in an aqueous solution having a pH of 4.0 and containing 40.0 g/l of nickel and 1.5 g/l of phosphorus under conditions of current density of 6 A/dm$^2$ to form a diffusion preventive layer. The attached amounts at this moment were 9.1 mg/dm$^2$ for nickel and 0.9 mg/dm$^2$ for phosphorus.

In addition, on this diffusion preventive layer, electroplating was carried out to form an ultra-thin copper layer with a thickness of 3 µm, using a copper sulfate plating solution containing 80 g/l of copper and 160 g/l of sulfuric acid under current density of 30 A/dm$^2$. And then, surface-roughening treatment was carried out in which copper particles were attached onto this ultra-thin copper layer, using the conventional method.

As an anticorrosive treatment and a surface treatment, zinc-plating and chromate treatment were carried out by a conventional method on the ultra-thin copper layer that had been subjected to the surface-roughening treatment. Subsequently, the resultant copper foil was immersed in an aqueous solution of 2.0 g/l vinyltris(2-methoxyethoxy)silane for 5 seconds, taken out from the solution, dried under heated air at a temperature of 100° C. to carry out a treatment by the silane-coupling agent and to give an ultra-thin copper foil A with a carrier foil as shown in FIG. 2.

Example 2

Formation of a release layer 2, formation of a diffusion preventive layer 3, electrochemical deposition of copper, surface-roughening treatment, anticorrosive treatment and surface treatment were carried out in the same manner as in Example 1, except that a diffusion preventive layer was formed by Ni—Co electroplating in an aqueous solution having a pH of 3.5 and containing 40.0 g/l of nickel and 7.5 g/l of cobalt under conditions of current density of 6 A/dm$^2$. Attached amounts by plating of the diffusion preventive layer 3 were 3.9 mg/dm$^2$ for nickel and 6.1 mg/dm$^2$ for cobalt.

Example 3

Formation of a release layer 2, formation of a diffusion preventive layer 3, electrochemical deposition of copper, surface-roughening treatment, anticorrosive treatment and surface treatment were carried out in the same manner as in Example 1, except that a diffusion preventive layer was formed by electrolytic Co—Cu plating in an aqueous solution having a pH of 3.5 and containing 8.0 g/l of cobalt and 4.0 g/l of copper under conditions of current density of 2.0 A/dm$^2$. Attached amounts by plating of the diffusion preventive layer were 8.8 mg/dm$^2$ for cobalt and 1.2 mg/dm$^2$ for copper.

Example 4

Formation of a release layer 2, formation of a diffusion preventive layer 3, electrochemical deposition of copper, surface-roughening treatment, anticorrosive treatment and surface treatment were carried out in the same manner as in Example 1, except for using a matte surface (surface roughness of the matte side: Rz=3.1 μm) of an untreated electrodeposited copper foil with a thickness of 35 μm (carrier foil 1).

Example 5

Formation of a release layer 2, formation of a diffusion preventive layer 3, electrochemical deposition of copper, surface-roughening treatment, anticorrosive treatment and surface treatment were carried out in the same manner as in Example 1, except for using a carrier foil in which a shiny side of an untreated electrodeposited copper foil with a thickness of 35 μm (carrier foil 1) was subjected to surface-roughening treatment (surface roughness after roughening treatment Rz=3.2 μm) by attaching thereon copper particles (average particle diameter of copper particles was 2.3 μm. Here, the average particle diameter is an average value of particle diameters measured at 10 points randomly selected from a photographed surface by scanning electron microscope.) using a conventional method.

Example 6

Formation of a release layer 2, formation of a diffusion preventive layer 3, electrochemical deposition of copper, surface-roughening treatment, anticorrosive treatment and surface treatment were carried out in the same manner as in Example 1, except for using a surface which had been finished by rolling (surface roughness: Rz=0.6 μm) of a rolled copper foil with a thickness of 35 μm (carrier foil 1).

Example 7

Formation of a release layer 2, formation of a diffusion preventive layer 3, electrochemical deposition of copper, surface-roughening treatment, anticorrosive treatment and surface treatment were carried out in the same manner as in Example 1, except for using a carrier foil in which a roll-finished surface of a rolled copper foil with a thickness of 35 μm (carrier foil 1) was subjected to surface-roughening treatment (surface roughness after roughening treatment Rz=0.8 μm) by attaching thereon copper particles (average particle diameter of copper particles was 1.0 μm. Here, the average particle diameter is an average value of particle diameters measured at 10 points randomly selected from a photographed surface by scanning electron microscope) using a conventional method.

Example 8

Formation of a release layer 2, formation of a diffusion preventive layer 3, electrochemical deposition of copper, surface-roughening treatment, anticorrosive treatment and surface treatment were carried out in the same manner as in Example 1, except for subjecting a shiny side (shiny side roughness Rz=1.4 μm) of an untreated electrodeposited copper foil with a thickness of 35 μm (carrier foil 1) to chromate treatment using an alkali chromate solution containing 10 g/l of CrO$_3$ and a pH of 11.0 under conditions of 0.1 A/dm$^2$. Attached amount of chromium on the carrier foil was 0.010 mg/dm$^2$.

Example 9

Formation of a diffusion preventive layer 3, formation of a release layer 2, electrochemical deposition of copper, surface-roughening treatment, anticorrosive treatment and surface treatment were carried out in this order in the same manner as in Example 1, using a carrier foil in which a roll-finished surface of a rolled copper foil with a thickness of 35 μm (carrier foil 1) was subjected to surface-roughening treatment (surface roughness after roughening treatment Rz=0.8 μm) by attaching thereon copper particles (average particle diameter of copper particles was 1.0 μm. Here, the average particle diameter is an average value of particle diameters measured at 10 points randomly selected from a photographed surface by scanning electron microscope) using a conventional method.

Example 10

Formation of a release layer 2, formation of a diffusion preventive layer 3, electrochemical deposition of copper, surface-roughening treatment, anticorrosive treatment and surface treatment were carried out in this order in the same manner as in Example 1, except that as a diffusion preventive layer, copper oxide was formed by conducting anodic oxidation which was known as a black oxidation treatment in an electrolysis solution that could generate black copper oxide under current density of 1.5 A/dm$^2$.

Example 11

A copper foil B with a resin as shown in FIG. 3 was prepared by coating a resin varnish, using a roll coater, to have a thickness of 6.0 mg/dm$^2$ on a surface of an ultra-thin copper foil A with a carrier foil that had already been treated with a silane-coupling agent in the same manner as in Example 1, followed by heat treatment at a temperature of 160° C. for 5 minutes to form an insulating resin layer at B stage.

In this example, the resin varnish was prepared by mixing 130 parts by weight of Epiclon 1121-75M (trade name; a bisphenol A type epoxy resin available from Dainippon Ink and Chemicals Incorporated), 2.1 parts by weight of dicyandiamide, 0.1 part by weight of 2-ethyl-4-methyl imidazole and 20 parts by weight of methyl cellosolve.

Comparative Example 1

Formation of a release layer 2, electrochemical deposition of copper, surface-roughening treatment, anticorrosive treatment and surface treatment were carried out in the same manner as in Example 1, except that a diffusion preventive layer 3 was not provided on a release layer 2.

Comparative Example 2

Formation of a release layer 2 was carried out by dipping a shiny side (shiny side roughness Rz=1.4 μm) of an untreated electrodeposited copper foil with a thickness of 35 μm (carrier foil 1) in a solution having a pH of 4.1 and containing 20 g/l of $Na_2Cr_2O_7$. Attached amount of chromium on the carrier foil was 0.028 $mg/dm^2$. Subsequently, on this chromate layer, a copper-nickel alloy layer was formed in an aqueous solution having a pH of 5.2 and containing 5 g/l of copper and 10 g/l of nickel under current density of 3.0 $A/dm^2$. Attached amounts by plating of the copper-nickel alloy layer were 7.5 $mg/dm^2$ for copper and 2.5 $mg/dm^2$ for nickel.

Preparation of Samples for Evaluation
(1) Preparation of One Surface Copper Clad Laminated Board for Carrier-Peel Strength Measurement Each of the above-mentioned ultra-thin copper foils A with a carrier (Examples 1–10 and. Comparative Examples 1 and 2) and the copper foil B with a resin (Example 11) was cut in a size of 250 mm in length×250 mm in width, and then, it was mounted on a glass fiber epoxy prepreg sheet (FR-4) with a number of sheets having a thickness after hot pressing of 1 mm, so that the surface 4a subjected to the surface-roughening treatment became a contacting surface. The whole sheets with the foil were placed between two flat stainless steel plates and heated at a temperature of 170° C. under a pressure of 50 $kg/cm^2$ for 60 minutes, and then, the carrier foil 1 was peeled off with the release layer 2 to obtain a FR-4 one surface copper clad laminated board for carrier-peel strength with a thickness of 1 mm.

In addition, each of the above ultra-thin copper foils A with a carrier (Examples 1–10 and Comparative Examples 1 and 2) was cut in a size of 250 mm in length×250 mm in width, and then, it was mounted on a polyimide sheet (UPILEX-VT available from UBE Industries, Ltd.) with a thickness of 50 μm so that the surface 4a subjected to the surface-roughening treatment became a contacting surface. The whole sheet with the foil was placed between two flat stainless steel plates and heated at a temperature of 330° C. under a pressure of 2 $kg/cm^2$ for 10 minutes with a vacuum press of 20 torr, and then, heated at a temperature of 330° C. under a pressure of 50 $kg/cm^2$ for 5 minutes to obtain a polyimide one surface copper clad laminated board with a carrier foil 1 for carrier-peel strength.

(2) Preparation of One Surface Copper Clad Laminated Board for Pin-Hole Measurement A one surface copper clad laminated board for pin-hole measurement was prepared by the same process as in the preparation of the above-mentioned FR-4 one surface copper clad laminated board for carrier-peel strength.

(3) Preparation of One Surface Copper Clad Laminated Board for Drilling Holes by Laser.

A one surface copper clad laminated board for drilling holes by laser was prepared by the same process as in the preparation of the above-mentioned FR-4 one surface copper clad laminated board for carrier-peel strength.

Evaluations on Characteristics
(1) Carrier-Peel Strength:

From the one surface copper clad laminated board with a carrier foil 1 prepared by the method of the above (1), a sample was cut out, and then, a carrier foil 1 was peeled off from an electrodeposited copper-plating layer 4 with a width of 10 mm of the test sample according to a method defined in JIS C6511 to measure strength at which peeling took place. However, since the copper foil obtained in Example 11 was a copper foil with an epoxy resin, measurement was not carried out for measurement of polyimide carrier-peel strength. The evaluation results are shown in Table 1. Measurement values of 0.02 to 0.10 kN/m mean that peeling took place easily, and it was shown that in case of FR-4 carrier-peel strength, it was peeled off easily irrespective of existence of a diffusion preventive layer 3, since the temperature employed for laminating press was 170° C. However, in case of a polyimide carrier-peel strength, the temperature employed for laminating press was as high as 330° C., and therefore, an existence of the diffusion preventive layer made a big difference in peeling property. In Comparative example 1 where no said layer had been provided, the copper layer could not be peeled off and in Comparative example 2, peeling could not carry out here and there and a phenomenon in which a part of the copper electroplating layer 4 is peeled off from the substrate and adhered to the carrier foil can be observed. To the contrary, in Examples 1 to 10, peeling properties were excellent.

(2) Pin-Hole Measurement:

The one surface copper clad laminated board in a size of 250 mm in length×250 mm in width prepared in the above method (2) was irradiated with light from the resin substrate side in a dark room, and a number of pin-holes were counted by transmitted light.

In Examples 1 to 10, their pinhols are all 0. To the contrary, in Comparative examples 1 and 2, pinholes were observed, and especially in Comparative example 2, it was observed many pinholes which are unable level to use as a copper foil for fine pattern.

TABLE 1

| | Carrier-peel strength | | |
|---|---|---|---|
| | FR-4 carrier-peel strength (kN/m) | PI carrier-peel strength (kN/m) | Pin-hole (number) |
| Example 1 | 0.030 | 0.080 | 0 |
| Example 2 | 0.025 | 0.037 | 0 |
| Example 3 | 0.015 | 0.030 | 0 |
| Example 4 | 0.040 | 0.085 | 0 |
| Example 5 | 0.045 | 0.090 | 0 |
| Example 6 | 0.015 | 0.050 | 0 |
| Example 7 | 0.030 | 0.062 | 0 |
| Example 8 | 0.041 | 0.073 | 0 |
| Example 9 | 0.030 | 0.090 | 0 |
| Example 10 | 0.033 | 0.095 | 0 |
| Example 11 | 0.030 | — | 0 |
| Comparative example 1 | 0.046 | Peeling failed | 6 |
| Comparative example 2 | 0.030 | 0.200 | 28 |

(1) Drilling by Laser

With respect to the one surface copper clad laminated board prepared by the above preparation method (3), evaluation was made on penetrating property of a copper foil by one-shot process, using $CO_2$ gas laser under the processing condition shown below, with the mask and pulse interval set at 1.4ϕ and 13 μsec, respectively, while changing the pulse energy.

The results are shown in Table 1. It was possible to drill the copper foils obtained in Examples 1 to 11 with lower pulse energy compared to one obtained in Comparative example 2. On the other hand, it was impossible to drill the copper foil of Comparative example 1 with a size of 100 μm within the range of pulse energy of 10 mJ to 18 mJ.

TABLE 2

Results of drilling hole by laser

| | Pulse energy (mJ) at which laser drilling becomes feasible |
|---|---|
| Example 1 | 14 |
| Example 2 | 12 |
| Example 3 | 10 |
| Example 4 | 13 |
| Example 5 | 10 |
| Example 6 | 15 |
| Example 7 | 10 |
| Example 8 | 14 |
| Example 9 | 15 |
| Example 10 | 10 |
| Example 11 | 14 |
| Comparative Example 1 | Drilling by laser failed in one-shot |
| Comparative Example 2 | 18 |

Processing Conditions
Device: ML605GTXII-5100U available from Mitsubishi Electrics Co., Japan
Condition: hole diameter of 100 μm
Pulse interval: 13 μsec
Mask: φ1.4 mm

UTILIZABILITY IN INDUSTRY

As is apparent from the above description, each of the ultra-thin copper foil with a carrier and the copper foil with a resin of the present invention are provided by a combination of a release layer and a diffusion preventive layer, whereby facilitating peeling of the carrier from the copper electroplating layer, even when a polyimide resin substrate is used which is prepared by heating at a high temperature under pressure for attachment. In addition, the diffusion preventive layer was plated with a material which well absorbs light at a wavelength that $CO_2$ gas laser oscillates, therefore, it enables a process of drilling of the substrate resin directly from the surface of the diffusion preventive layer through the copper electroplating layer, without using a conventional conformal mask method. Thus, it has an advantage in that production process for the copper clad laminated board can be simplified.

The invention claimed is:

1. An ultra thin copper foil which comprises a diffusion preventive layer, a release layer and an ultra-thin copper foil formed by copper electroplating, laminated in this order onto a surface of a carrier foil,
    wherein said surface of the carrier foil is a matte side or a shiny side of an untreated electrodeposited copper foil or an untreated electrodeposited copper alloy foil, and is subjected to roughening treatment; and
    wherein a surface of the ultra-thin copper foil opposite to the release layer, is subjected to roughening treatment and is covered by an insulating resin layer which is in a B-stage state.

2. The ultra thin copper foil according to claim 1, wherein said surface of the ultra-thin copper foil opposite to the release layer, subjected to roughening treatment is further subjected to at least on treatment selected from zinc plating, nickle plating, nickle-phosphorus plating, chromate and silane coupling agent, before covered by said insulating resin layer.

3. The ultra thin copper foil according to claim 1, wherein the release layer is a chromium layer or a chromium hydrated oxide layer.

4. The ultra thin copper foil according to claim 1, wherein the diffusion preventive layer comprises at least one metal selected from the group consisting of nickel, cobalt, iron, chromium, molybdenum, tungsten, copper, aluminum and phosphorus, and is a layer of single metal, an alloy layer of two or more metals or a layer of at least one metal oxide.

5. The ultra thin copper foil according to claim 1, wherein the carrier foil is a foil of copper or copper alloy.

6. The ultra thin copper foil according to claim 1, wherein the carrier foil is an electrodeposited copper foil, an electrodeposited copper alloy foil, a rolled copper foil or a rolled copper alloy foil.

7. The ultra thin copper foil according to claim 1, wherein the roughening treatment of the carrier foil and the ultra-thin copper foil, is by chemical or electrochemical method or by metal particles attached by electroplating.

8. The ultra thin copper foil according to claim 7, wherein a particle size of the roughening treatment is 5 μm or less.

9. The ultra thin copper foil according to claim 1, wherein the ultra-thin copper foil has a thickness of 12 μm or less.

10. The ultra thin copper foil according to claim 1, wherein the carrier foil has a thickness of 1 mm or less.

11. The ultra thin copper foil according to claim 10, wherein the carrier foil has a thickness of 7 μm to 70 μm.

12. The ultra thin copper foil which comprises a diffusion preventive layer, a release layer and an ultra-thin copper foil formed by copper electroplating, laminating in this order onto a surface of a carrier foil, wherein said carrier foil is rolled copper foil or a rolled copper alloy foil, and said surface is subjected to roughening treatment.

13. The ultra thin copper foil according to claim 12, wherein a surface of the ultra-thin copper foil opposite to the release layer, is subjected to roughening treatment and further subjected to at least one treatment selected from zinc plating, nickle plating, nickle-phosphorus plating, chromate and silane coupling agent, and thereafter is covered by an insulating resin layer.

14. A copper-clad laminated board comprising the ultra thin copper foil according to claim 1, being laminated onto a resin substrate.

15. The copper-clad laminated board according to claim 14, wherein the carrier foil is peeled off from the ultra-thin copper foil of the copper-clad laminated board.

16. A printed wiring board comprising the copper-clad laminated board according to claim 15, on the ultra-thin copper foil is formed into a wiring pattern.

17. A multi-layered printed wiring board, wherein plurality of printed wiring boards according to claim 16 are laminated.

* * * * *